(12) United States Patent
Liou et al.

(10) Patent No.: US 9,448,471 B2
(45) Date of Patent: Sep. 20, 2016

(54) PHOTO-MASK AND METHOD OF MANUFACTURING SEMICONDUCTOR STRUCTURES BY USING THE SAME

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Teng-Chin Kuo, Taipei (TW); Yuan-Chi Pai, Tainan (TW); Chun-Chi Yu, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 88 days.

(21) Appl. No.: 14/335,949

(22) Filed: Jul. 21, 2014

(65) Prior Publication Data

US 2016/0018728 A1    Jan. 21, 2016

(51) Int. Cl.
*G03F 1/38* (2012.01)
*G03F 7/20* (2006.01)
*H01L 21/027* (2006.01)

(52) U.S. Cl.
CPC . *G03F 1/38* (2013.01); *G03F 7/20* (2013.01); *H01L 21/0274* (2013.01)

(58) Field of Classification Search
CPC ........................................... G03F 1/00
See application file for complete search history.

(56) References Cited

U.S. PATENT DOCUMENTS

| 8,437,967 | B2 | 5/2013 | Badger | |
| 8,679,729 | B2 * | 3/2014 | Lee | G03F 1/144 430/319 |
| 2012/0171865 | A1 * | 7/2012 | Yoo | H01L 21/0273 438/694 |
| 2013/0216795 | A1 | 8/2013 | Zhou | |
| 2014/0268090 | A1 * | 9/2014 | Ning | G03F 7/70433 355/77 |

* cited by examiner

*Primary Examiner* — Kathleen Duda
(74) *Attorney, Agent, or Firm* — Winston Hsu; Scott Margo

(57) ABSTRACT

The present invention provides a photo-mask for manufacturing structures on a semiconductor substrate, which comprises a photo-mask substrate, a first pattern, a second pattern and a forbidden pattern. A first active region, a second active region are defined on the photo-mask substrate, and a region other than the first active region and the second active region are defined as a forbidden region. The first pattern is disposed in the first active region and corresponds to a first structure on the semiconductor substrate. The second pattern is disposed in the second active region and corresponds to a second structure on the semiconductor substrate. The forbidden pattern is disposed in the forbidden region, wherein the forbidden pattern has a dimension beyond resolution capability of photolithography and is not used to form any corresponding structure on the semiconductor substrate. The present invention further provides a method of manufacturing semiconductor structures.

20 Claims, 5 Drawing Sheets

US 9,448,471 B2

PHOTO-MASK AND METHOD OF MANUFACTURING SEMICONDUCTOR STRUCTURES BY USING THE SAME

BACKGROUND OF THE INVENTION

1. Field of the Invention

The present invention relates to a photo-mask and a method of manufacturing semiconductor structures by using the same, and more particularly, to a photo-mask with forbidden pattern and a method of manufacturing a semiconductor structure by using the same.

2. Description of the Prior Art

To form fine patterns of semiconductor devices, etc., in the exposure process, phase shift masks, such as halftone phase shift mask, Levenson phase shift mask, etc. are used. The exposure with phase shift masks improves the exposure latitude, focal depth, etc. and is effective to form fine patterns. However, the phase shift masks are expensive, and recently, the mask (reticle) cost increase is a large serious problem.

As a countermeasure to the mask cost increase, it is proposed to use a multi-layer reticle (MLR) having multiple cells that used to define different physical layers and/or structures of an integrated circuit. Fabrication of multi-layer reticles requires preparation of datasets describing the reticles, fabrication of the reticles and inspection of the reticles. While the fabrication of multi-layer reticles can reduce mask fabrication costs compared to single-layer reticles where all cells are the same, the logistics requirements and inspections of multi-layer reticles can actually increase costs. Accordingly, there exists a need in the art to mitigate the deficiencies and limitations described hereinabove.

SUMMARY OF THE INVENTION

The present invention therefore provides a photo-mask, especially an MLR photo-mask, with novel forbidden patterns so as to form fine semiconductor structures.

According to one embodiment, a photo-mask for manufacturing structures on a semiconductor substrate is provided. The photo-mask comprises a photo-mask substrate, a first pattern, a second pattern and a forbidden pattern. A first active region, a second active region are defined on the photo-mask substrate, and a region other than the first active region and the second active region are defined as a forbidden region. The first pattern is disposed in the first active region, wherein the first pattern corresponds to a first structure on the semiconductor substrate. The second pattern is disposed in the second active region, wherein the second pattern corresponds to a second structure on the semiconductor substrate. The forbidden pattern is disposed in the forbidden region, wherein the forbidden pattern has a dimension beyond resolution capability of photolithography and is not used to form any corresponding structure on the semiconductor substrate.

According to another embodiment, a method of forming semiconductor structures is provided. A semiconductor substrate is provided and a photo-mask shown above is provided. The photo-mask comprises a photo-mask substrate, a first pattern, a second pattern and a forbidden pattern. A first active region, a second active region are defined on the photo-mask substrate, and a region other than the first active region and the second active region are defined as a forbidden region. The first pattern is disposed in the first active region, wherein the first pattern corresponds to a first structure on the semiconductor substrate. The second pattern is disposed in the second active region, wherein the second pattern corresponds to a second structure on the semiconductor substrate. The forbidden pattern is disposed in the forbidden region, wherein the forbidden pattern has a dimension beyond resolution capability of photolithography and is not used to form any corresponding structure on the semiconductor substrate. Next, a semiconductor substrate is provided. The first structure is formed on the semiconductor substrate by providing a light source and using the photo-mask with the second active region being shielded. Then, the second structure is formed on the first structure by providing the light source and using the photo-mask with the first active region being shielded, wherein the forbidden pattern does not form any corresponding structure on the semiconductor substrate.

The present invention provides a photo-mask with forbidden pattern so as to avoid deformation of structures. The photo-mask in the present invention is especially applied to multi-layer reticle. By using the photo-mask with forbidden pattern, fine and precise semiconductor structure can be formed.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
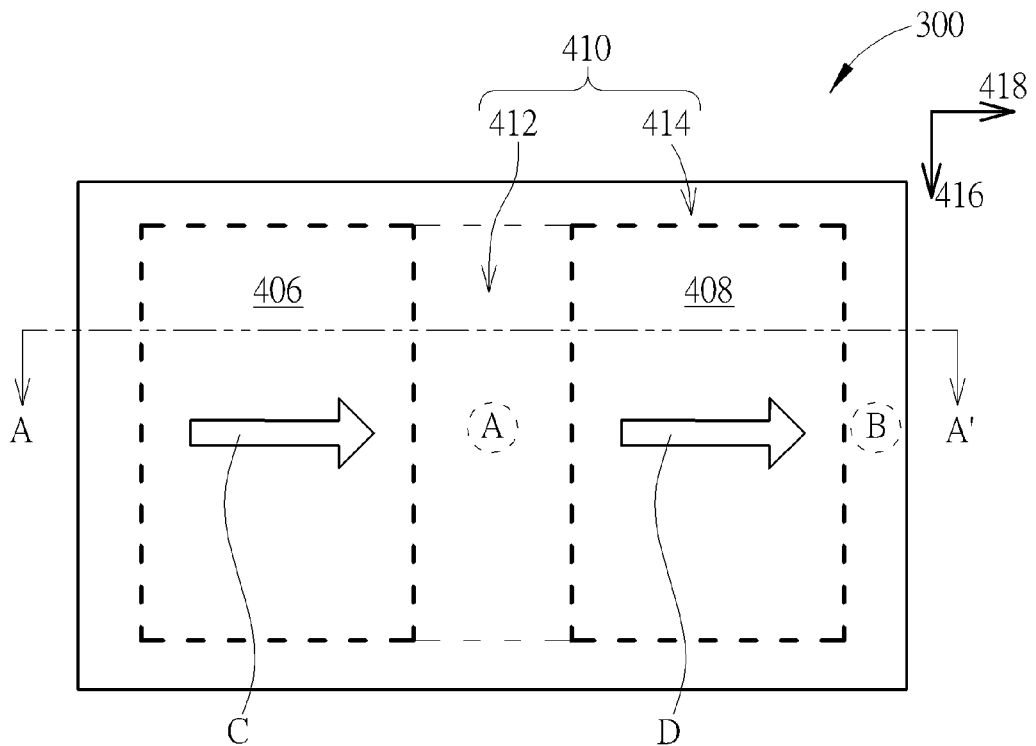
FIGS. 1 and 2 illustrate schematic diagrams of a photo-mask according to one embodiment of the present invention.
Figure 2:
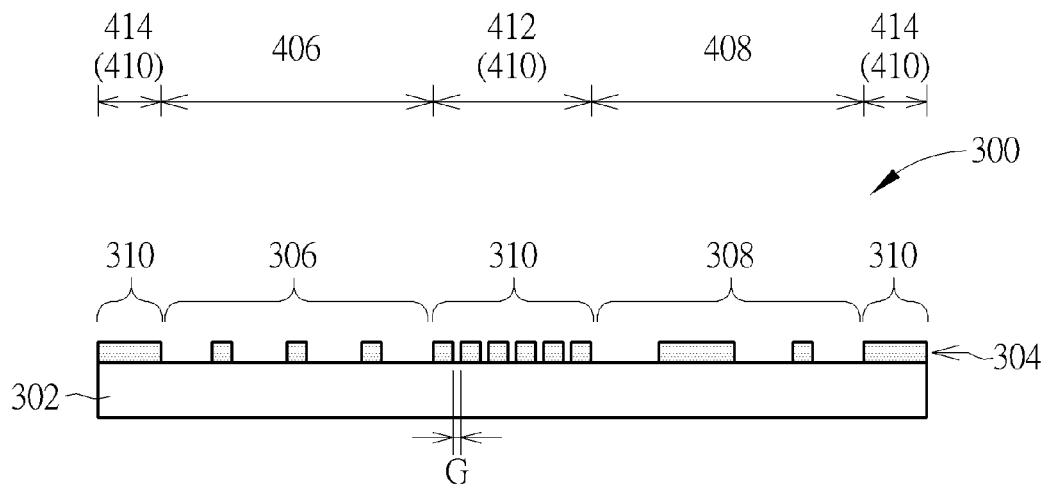

Please refer to FIGS. 1 and 2, which illustrate schematic diagrams of a photo-mask according to one embodiment of the present invention, wherein FIG. 2 is a cross-sectional view taken along line AA' of FIG. 1. As shown in FIGS. 1 and 2, the photo-mask 300 of the present invention includes a photo-mask substrate 302. In one embodiment, the photo-mask substrate 302 is a transparent substrate which can be made of organic or inorganic material, such as glass, quartz, plastic, acrylic resin or other suitable materials.

A first active region 406, a second active region 408 and a forbidden region 410 are defined on the substrate 302. In one embodiment, the forbidden region 410 includes a central forbidden region 412, which is disposed between and separates the first active region 406 and the second active region 408, and a peripheral forbidden region 414, which encompasses the first active region 406, the second active region 408 and the central forbidden region 412. In one embodiment, both the first active region 406 and the second active region 408 coincide to a layout of a die. In another embodiment, they can coincide to a layout of a part of a die.

A material layer 304 is disposed on a surface of the photo-mask substrate 300. In one embodiment, the material layer 304 can be translucent or opaque when exposing to light. In one preferred embodiment, the material layer 304 is metal and more preferably, it is chrome. The material layer 304 includes patterns corresponding to the layout of the integrated circuit. For example, the material layer 304 includes a first pattern 306 in the first active region 406, a second pattern 308 in the second active region 408, a forbidden pattern 310 in the forbidden region 410.

Figure 3:
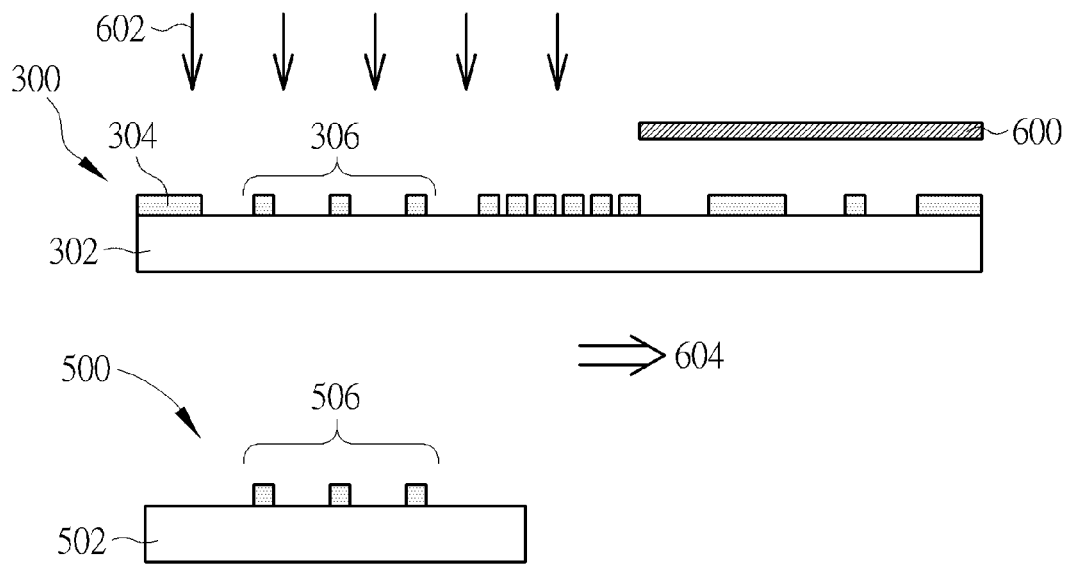
FIGS. 3 and 4 show schematic diagrams of lithography process to manufacture a semiconductor according to one embodiment of the present invention.

In one embodiment, the photo-mask 300 is a multi-layer-reticle (MLR). The first pattern 306 is corresponding to a first structure (not shown in FIGS. 1 and 2) and the second pattern 308 is corresponding to a second structure (not shown in FIGS. 1 and 2). In one preferred embodiment, the first structure and the second structure are in one wafer but are not in the same layer. More preferably, the first structure and the second structure are two layer, one being disposed above or below the other, and the orientation of the first pattern 306 (for example, arrow C in FIG. 1) and the orientation of the second pattern 308 (arrow D) are matched such that the formed first structure and the second structure can align with each other in a vertical dimension. In an explanatory embodiment, please refer to FIGS. 3 and 4, which show schematic diagrams of a process to manufacture a semiconductor structure according to one embodiment of the present invention. As shown in FIG. 3, a semiconductor substrate 502 is provided. The term "semiconductor substrate" in the present invention refers to any substrate having a structure which is formed by a conventional semiconductor process, such as photo-lithography process. In one embodiment, the semiconductor substrate 502 can includes a substrate comprising semiconductor material, such as a silicon substrate, an epitaxial silicon substrate, a silicon germanium substrate, a silicon carbide substrate or a silicon-on-insulator (SOI) substrate. In another embodiment, the semiconductor substrate 502 can include a non-semiconductor substrate, such as a glass substrate for a thin-film-transistor display device formed thereon, or a fused quartz for a photo mask formed thereon. In another embodiment, the semiconductor substrate 502 can include a plurality of doping regions, one or a plurality of dielectric layers or a metal interconnect system in which one or a plurality of microelectronic components are disposed therein, such as a complementary metal oxide semiconductor (CMOS) or a photo-diode. In one preferred embodiment, the semiconductor substrate 502 in FIG. 3 coincides with a die region of a wafer.

Subsequently, a first photo-etching-process (PEP) is performed by using the photo-mask 300 as a mask, so as to form a first structure 506 on the semiconductor substrate 502. For example, a first material layer (not shown) and a first photoresist layer (not shown) are formed on the semiconductor substrate 502. A first lithography process is performed by using the photo-mask 300 as a mask. It is noted that the photo-mask 300 in the present embodiment is an MLR, and a shielding 600 is disposed above the second active region 408 of the photo-mask 300 and only the first active region 406 and a part of the forbidden region 410 is exposed to the first light source 602. After the first lithography process, the first pattern 306 is transferred to the first photoresist layer to form a patterned first photoresist layer. Thereafter, an etching process is performed by using the patterned first photoresist layer as a mask to etch first material layer such that a first structure 506 corresponding to the first pattern 306 is therefore formed.

Figure 4:
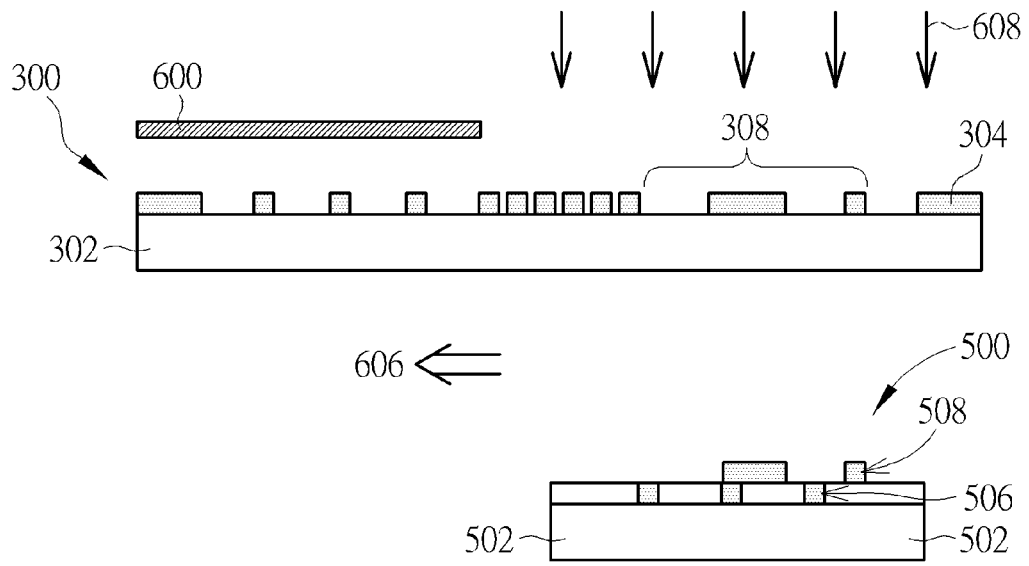

Next, as shown in FIG. 4, a second photo-etching-process (PEP) is performed by applying a second light source 608 and by using the photo-mask 300 as a mask, so as to form a second structure 508 on the first structure 506. In one embodiment, the first light source 602 and the second light source 608 can be the same or can be different. In a detailed embodiment, a second material layer (not shown) and a second photoresist layer (not shown) are formed on the semiconductor substrate 502. A second lithography process is performed by using the photo-mask 300 as a mask with the first active region 406 being shielded. After the second lithography process, the second pattern 308 is transferred to the second photoresist layer to form a patterned second photoresist layer. Thereafter, another etching process is performed by using the patterned second photoresist layer as a mask to etch second material layer such that a second structure 508 corresponding to the second pattern 308 is therefore formed. In one embodiment, the first structure 506 and the second structure 508 are a part of a metal interconnection system and directly contact with each other so as to form an electrical pathway.

Figure 5:
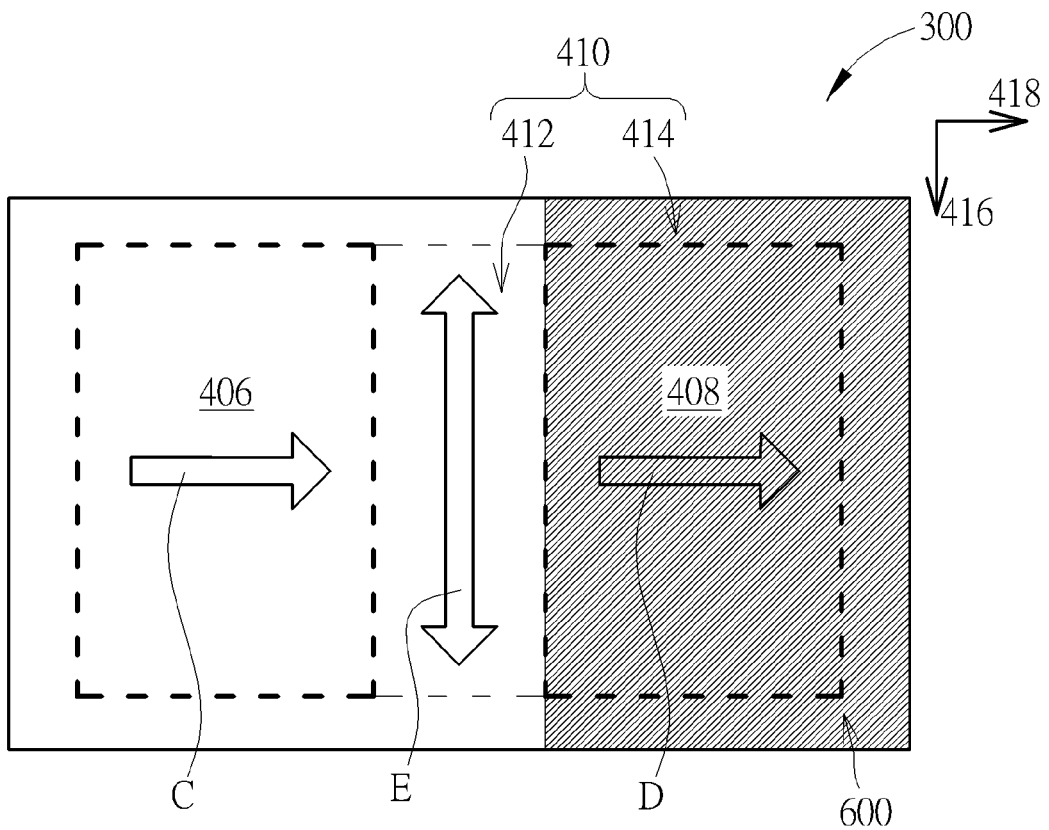
FIGS. 5 and 6 show schematic diagrams of the uneven thermal expansion of the photo-mask during the lithography process.
Figure 6:
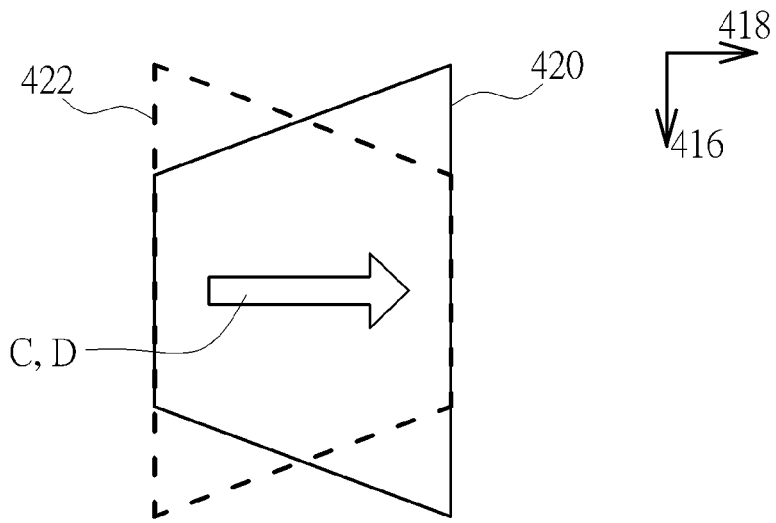

It is noted that the first light source 602 and the second light source 608 have a relative high energy, for example, a dipole light source, so as to form fine first structure 506 or fine second structure 508. However, due to the high energy of the first light source 602 and the second light source 608, during the lithography process, the material layer 304 of the photo-mask 300 would absorb the energy of the light and thermally expand. Please refer to FIGS. 5 and 6, which are schematic diagrams of the thermal expansion of the photo-mask during the lithography process. As shown in FIG. 5 in conjunction with FIG. 3, when the first lithography process is performed with the second active region 408 being shielded, since only the material layer 304 in the left part of the photo-mask 300 (at least including the first active region 406 and the central forbidden region 412) absorbs the light energy while the material layer 304 in right part is not, the material layer 304 as well as the photo-mask 300 would expand. On the other hand, since the central forbidden region 412 is used for shielding the light source 602/608 during the first lithography or the second lithography, the central forbidden region 412 is nearly completely covered with the material layer 304. Thus, the material layer 304 in the central forbidden region 412 would easily expand along a direction of arrow E. The degree of the expansion along arrow D would depend on the covering area of the material layer 304 in the central forbidden region 412 and it becomes most serious when the central forbidden region 412 is completely covered by the material layer 304, as those situation in conventional arts. In the first lithography process, the thermally expansion of the material layer 304 of the photo-mask 300 result in an uneven deformation of the first pattern 306, such as the trapezoid deformation 420 in FIG. 6, and it also leads to the deformation of the first structure 506. For the same reason, when the second lithography process is performed with the first active region 406 being shielded, the material layer 304 as well as the photo-mask 300 would expand along at least one direction, also resulting in a trapezoid deformation 422 of the second pattern 308, as well as the second structure 508. If the deformation 420 and 422 are too serious, misalignment between the first structure 506 and the second structure 508 in the vertical dimension still occurs even though the orientation of the first pattern 306 (arrow C) and the orientation of the second pattern 308 are matched (arrow D). For example, when a deformation difference between the original first pattern 306 and the expanded first pattern 306 along the direction 416 is over an acceptable range, such as 6 nm to 8 nm for 28 nm generation, misalignment could be happened.

To avoid the problems mentioned above, the photo-mask 300 of the present invention further includes a forbidden pattern 310 in the forbidden region 410. As shown in FIGS. 1 and 2, the forbidden pattern 310 can be disposed either in the central forbidden region 412 and/or in the peripheral forbidden region 414. The forbidden pattern 310 can decrease the area of material layer 304 and thus decrease the expanding of the photo-mask 300 during the lithography process. The problem of deformation of the first structure 506 and the second structure 508 can therefore be overcome. In one embodiment, the forbidden pattern 310 has a dimension beyond resolution capability of photo-lithography process so no structure corresponding to the forbidden pattern 310 will be formed on the semiconductor substrate 502. Specifically, a gap G between each forbidden pattern 310 is smaller than ¼ λ of the light source 602.

Figure 7:
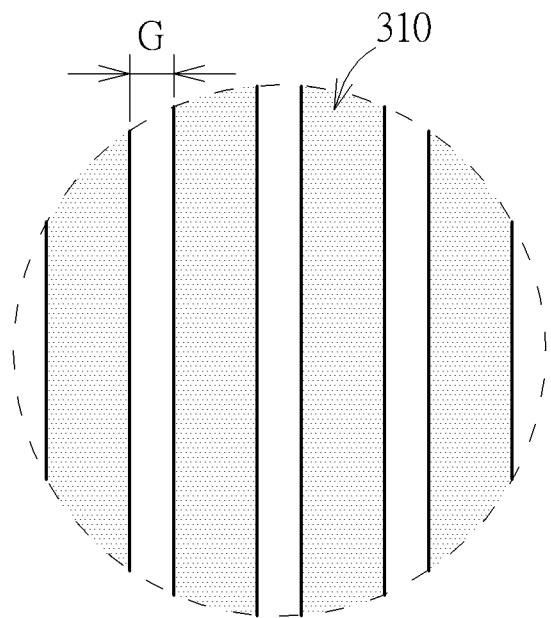
FIGS. 7, 8, 9 and 10 illustrate schematic diagrams of the forbidden pattern according to different embodiments of the present invention.
Figure 8:
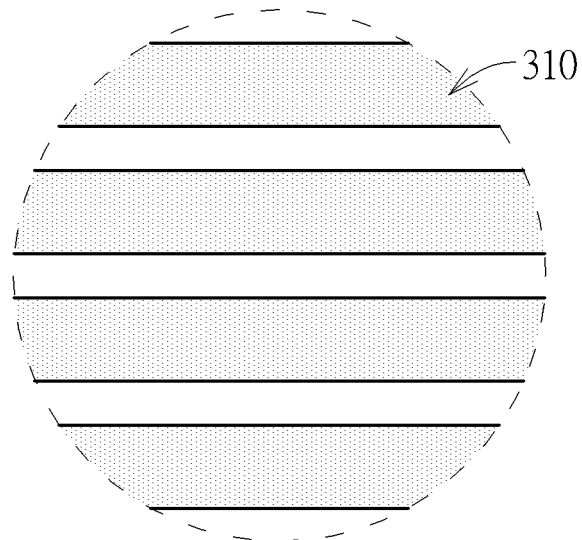
Figure 9:
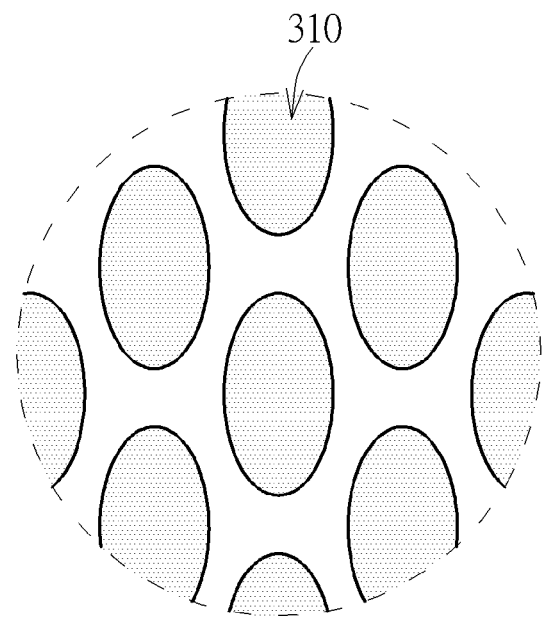
Figure 10:
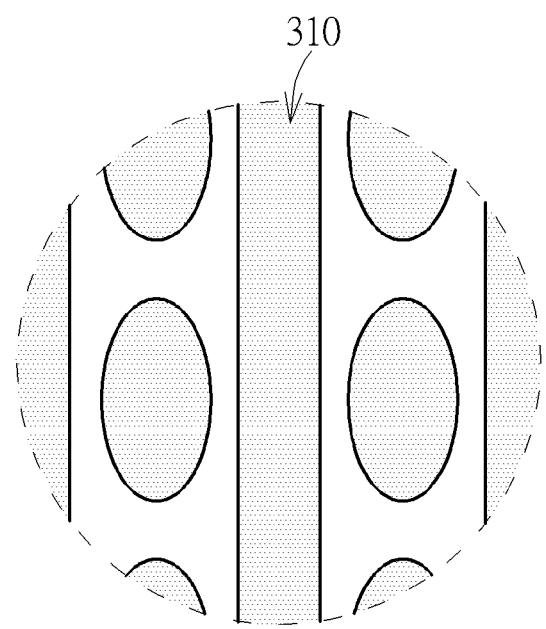

In the present invention, the forbidden pattern 310 can include any geometric shapes. Please refer to FIGS. 7, 8, 9 and 10, which illustrate schematic diagrams of the forbidden pattern according to different embodiments of the present invention, wherein FIGS. 7, 8, 9 and 10 are enlarged pictures of region A and/or region B of FIG. 1. As shown in FIG. 7, the forbidden pattern 310 can include a plurality of stripes stretching along a direction 416, while as shown in FIG. 8, the forbidden pattern 310 can include a plurality of stripes stretching along a direction 418, wherein the direction 416 refers to a width direction and the direction 418 refers to length side. It is noted that the stretching direction of the stripes of the forbidden pattern 310 would depend on the layout of first pattern 306 or the layout of the second pattern 308, or even the dipole light source 602, 608. In another embodiment, as shown in FIG. 9, the forbidden pattern 310 can include a plurality of islands. In still another embodiment, as shown in FIG. 10, the forbidden pattern 310 includes a plurality of stripes and a plurality of islands. The density of the stripes and/or the islands of the forbidden pattern 310 can be adjusted according to the layout of first pattern 306 or the layout of the second pattern 308, or the dipole light source 602, 608.

In light of above, the present invention provides a photo-mask with forbidden pattern so as to avoid deformation of structures. The photo-mask in the present invention is especially applied to multi-layer reticle. By using the photo-mask with forbidden pattern, fine and precise semiconductor structure can be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photo-mask for manufacturing structures on a semiconductor substrate, comprising:
  a photo-mask substrate, wherein a first active region, a second active region separated from the first region are defined on the photo-mask substrate, a region other than the first active region and the second active region are defined as a forbidden region;
  a first pattern disposed in the first active region, wherein the first pattern corresponds to a first structure on the semiconductor substrate;
  a second pattern disposed in the second active region, wherein the second pattern corresponds to a second structure on the semiconductor substrate; and
  a forbidden pattern disposed in the forbidden region, wherein the forbidden pattern has a dimension beyond resolution capability of photolithography and is not used to form any corresponding structure on the semiconductor substrate.

2. The photo-mask according to claim 1, wherein the forbidden region comprises a central forbidden region and a peripheral forbidden region, the central forbidden region is disposed between the first active region and the second active region, and the peripheral forbidden region encompasses the first active region, the second active region and the central forbidden region.

3. The photo-mask according to claim 2, wherein the forbidden pattern is disposed in the central forbidden region.

4. The photo-mask according to claim 2, wherein the forbidden pattern is disposed in the peripheral forbidden region.

5. The photo-mask according to claim 1, wherein the forbidden pattern comprises a plurality of stripes.

6. The photo-mask according to claim 1, wherein the forbidden pattern comprises a plurality of islands.

7. The photo-mask according to claim 1, wherein the forbidden pattern comprises a plurality of stripes and a plurality of islands.

8. The photo-mask according to claim 1, wherein a ratio of a density of the forbidden pattern and a density of the first pattern is a first predetermined value, and a ratio of the density of the forbidden pattern and a density of the second pattern is a second predetermined value.

9. The photo-mask according to claim 1, wherein the photo-mask is a multi-layer-reticle (MLR).

10. A method of manufacturing semiconductor structures, comprising:
  providing a semiconductor substrate;
  providing a photo-mask, comprising:
    a photo-mask substrate, wherein a first active region, a second active region are defined on the photo-mask substrate, a region other than the first active region and the second active region are defined as a forbidden region;
    a first pattern disposed in the first active region, wherein the first pattern corresponds to a first structure on the semiconductor substrate;
    a second pattern disposed in the second active region, wherein the second pattern corresponds to a second structure on the semiconductor substrate; and
    a forbidden pattern disposed in the forbidden region, wherein the forbidden pattern has a dimension beyond resolution capability of photolithography and is not used to form any corresponding structure on the semiconductor substrate;
  forming the first structure on the semiconductor substrate by providing a first light source and using the photo-mask with the second active region being shielded; and
  forming the second structure on the semiconductor substrate by providing a second light source and using the photo-mask with the first active region being shielded, wherein the forbidden pattern does not form any corresponding structure on the semiconductor substrate.

11. The method of manufacturing semiconductor structures according to claim 10, wherein the forbidden region comprises a central forbidden region and a peripheral forbidden region, the central forbidden region is disposed between the first active region and the second active region, and the peripheral forbidden region encompasses the first active region, the second active region and the central forbidden region.

12. The method of manufacturing semiconductor structures according to claim 11, the forbidden pattern is disposed in the central forbidden region.

13. The method of manufacturing semiconductor structures according to claim 11, the forbidden pattern is disposed in the peripheral forbidden region.

14. The method of manufacturing semiconductor structures according to claim 10, wherein the forbidden pattern comprises a plurality of stripes.

15. The method of manufacturing semiconductor structures according to claim 10, wherein the forbidden pattern comprises a plurality of islands.

16. The method of manufacturing semiconductor structures according to claim 10, wherein the forbidden pattern comprises a plurality of stripes and a plurality of islands.

17. The method of manufacturing semiconductor structures according to claim 10, wherein the first pattern, the second pattern and the forbidden pattern is made of chrome.

18. The method of manufacturing semiconductor structures according to claim 10, wherein a gap of the forbidden pattern is smaller than $\frac{1}{4}\lambda$ of the first light source and $\frac{1}{4}\lambda$ of the second light source.

19. The method of manufacturing semiconductor structures according to claim 10, wherein a ratio of a density of the forbidden pattern and a density of the first pattern is a first predetermined value, and a ratio of the density of the forbidden pattern and a density of the second pattern is a second predetermined value.

20. The method of manufacturing semiconductor structures according to claim 10, wherein the first structure is in a one layer of a wafer and the second structure is in another layer of the wafer.

* * * * *